United States Patent
Fu

(10) Patent No.: US 8,831,333 B2
(45) Date of Patent: Sep. 9, 2014

(54) MASK PATTERN ANALYSIS APPARATUS AND METHOD FOR ANALYZING MASK PATTERN

(75) Inventor: Kuo Kuei Fu, Guishan Township, Taoyuan County (TW)

(73) Assignee: Nanya Technology Corporation, Tao-Yuan Hsien (TW)

( * ) Notice: Subject to any disclaimer, the term of this patent is extended or adjusted under 35 U.S.C. 154(b) by 316 days.

(21) Appl. No.: 13/495,873

(22) Filed: Jun. 13, 2012

(65) Prior Publication Data

US 2013/0336571 A1    Dec. 19, 2013

(51) Int. Cl.
*G06K 9/00*    (2006.01)

(52) U.S. Cl.
USPC .......................................... 382/144

(58) Field of Classification Search
USPC .......................................... 382/144
See application file for complete search history.

(56) References Cited

U.S. PATENT DOCUMENTS

| 8,670,605 B2 * | 3/2014 | Yanai | 382/141 |
| 2013/0174102 A1 * | 7/2013 | Leu | 716/52 |

FOREIGN PATENT DOCUMENTS

JP    2006214950 A  *  8/2006

* cited by examiner

*Primary Examiner* — Stephen R Koziol
*Assistant Examiner* — Totam Le
(74) *Attorney, Agent, or Firm* — Juan Carlos A. Marquez; Bacon & Thomas PLLC

(57) ABSTRACT

A pattern analysis method includes the steps of: grouping a plurality of polygons in a circuit layout into a plurality of polygon groups; locating a potential defect area of each polygon group according to an aerial image of the circuit layout; determining a representing point of the potential defect area of each polygon group; determining representing points of the plurality of polygons in each polygon group; and comparing a distribution pattern of the representing points of the plurality of polygons relative to the representing point of the potential defect area in one of the polygon groups with a distribution pattern of the representing points of the plurality of polygons relative to the representing point of the potential defect area in another of the polygon groups. The steps aforesaid are executed by a processor in a computer system.

18 Claims, 12 Drawing Sheets

MASK PATTERN ANALYSIS APPARATUS AND METHOD FOR ANALYZING MASK PATTERN

BACKGROUND OF THE INVENTION

1. Technical Field

The present invention relates to a pattern analysis system, and more particularly, to a mask pattern analysis system and a mask pattern analysis method in order to facilitate semiconductor lithography processes.

2. Background

As optical lithography advances into the 90 nm technology node and beyond, minimum feature size outpaces the introduction of advanced lithography hardware solutions. Optical proximity correction (OPC) is a widely used resolution enhancement technique for control of critical dimension. With OPC, photomask shapes are deliberately distorted to compensate for different amounts of pattern information diffracted at various pitches. The data generated by the OPC is then typically imported into a simulation tool, to confirm whether the OPC will have the desired corrective effect; this is sometimes called an optical and process rule check, or ORC. ORC is an important vehicle to predict the failure of pattern shapes and to check post-OPC aerial images against drawn shapes. If not aided by ORC, OPC may cause severe failures affecting the yield in manufacturing.

However, it is fairly time-consuming to conduct an ORC across the wafer if the aerial images are reviewed one by one. ORC can be run before OPC to determine if OPC is even necessary, at an intermediate point in an OPC run to determine if the results are good enough, or after OPC has been completed. Once this check is complete, the data is exported for use in IC manufacturing process. Typically, areas detected with bridging or pinching phenomenon are highlighted and subsequently reverted to OPC for further mask correction.

To solve the problem of excessive time consumption in the ORC step, a more systematic review method is required. An efficient ORC step is crucial to an efficient mask production process, which is expected to face more challenges with the decrease of technology node and the increase of the device density per chip.

SUMMARY

One embodiment provides a pattern analysis apparatus comprising a processor, which is configured to: group a plurality of polygons in a circuit layout into a plurality of polygon groups; locate a potential defect area of each polygon group according to an aerial image of the circuit layout; determine a representing point of the potential defect area of each polygon group; determine representing points of the plurality of polygons in each polygon group; and compare a distribution pattern of the representing points of the plurality of polygons relative to the representing point of the potential defect area in one of the polygon groups with a distribution pattern of the representing points of the plurality of polygons relative to the representing point of the potential defect area in another of the polygon groups.

One embodiment offers a method which comprises the steps of grouping a plurality of polygons in a circuit layout into a plurality of polygon groups; locating a potential defect area of each polygon group according to an aerial image of the circuit layout; determining a representing point of the potential defect area of each polygon group; determining representing points of the plurality of polygons in each polygon group; and comparing a distribution pattern of the representing points of the plurality of polygons relative to the representing point of the potential defect area in one of the polygon groups with a distribution pattern of the representing points of the plurality of polygons relative to the representing point of the potential defect area in another of the polygon groups. The steps of the method are conducted by a processor in a computer system.

The foregoing has outlined rather broadly the features and technical advantages of the present invention in order that the detailed description of the invention that follows may be better understood. Additional features and advantages of the invention will be described hereinafter, and form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The objectives and advantages of the present invention are illustrated with the following description and upon reference to the accompanying drawings in which.

DETAILED DESCRIPTION

Figure 1:
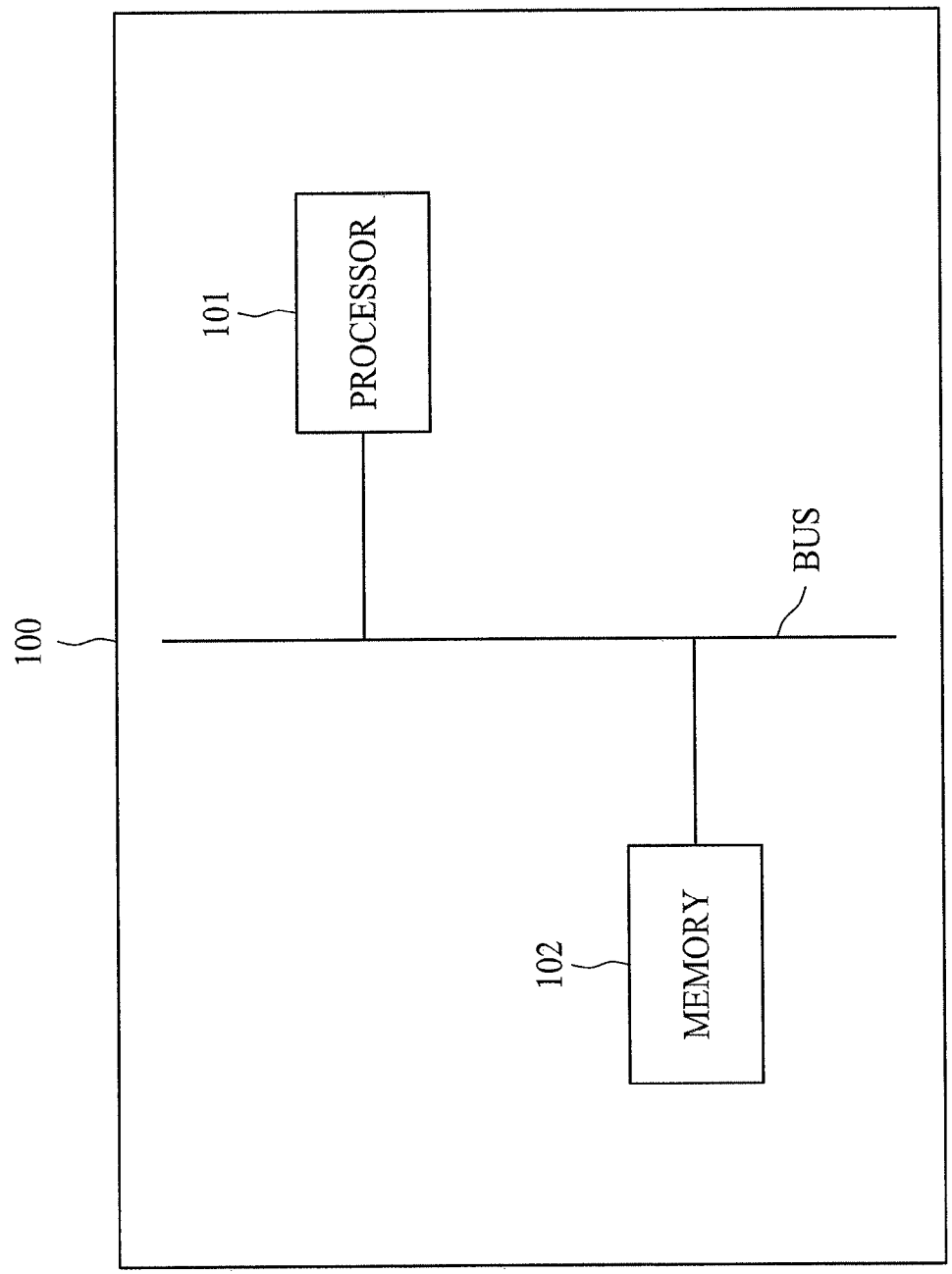
FIG. 1 shows a computer system including a processor and a memory, wherein the processor is configured to execute steps of the method for mask pattern analysis.

In some embodiments, in order to solve the problem of excessive time consumption in an optical rule check process, a more systematic review method is hereby provided to shorten the duration of the aerial image inspection. Some embodiments focuses on the recognition and the sorting of the patterns on the aerial images. The processes included in disclosed embodiments can be carried out by a processor 101 of a computer system 100 with a memory 102 for storing programs and data, shown in FIG. 1.

Figure 2:
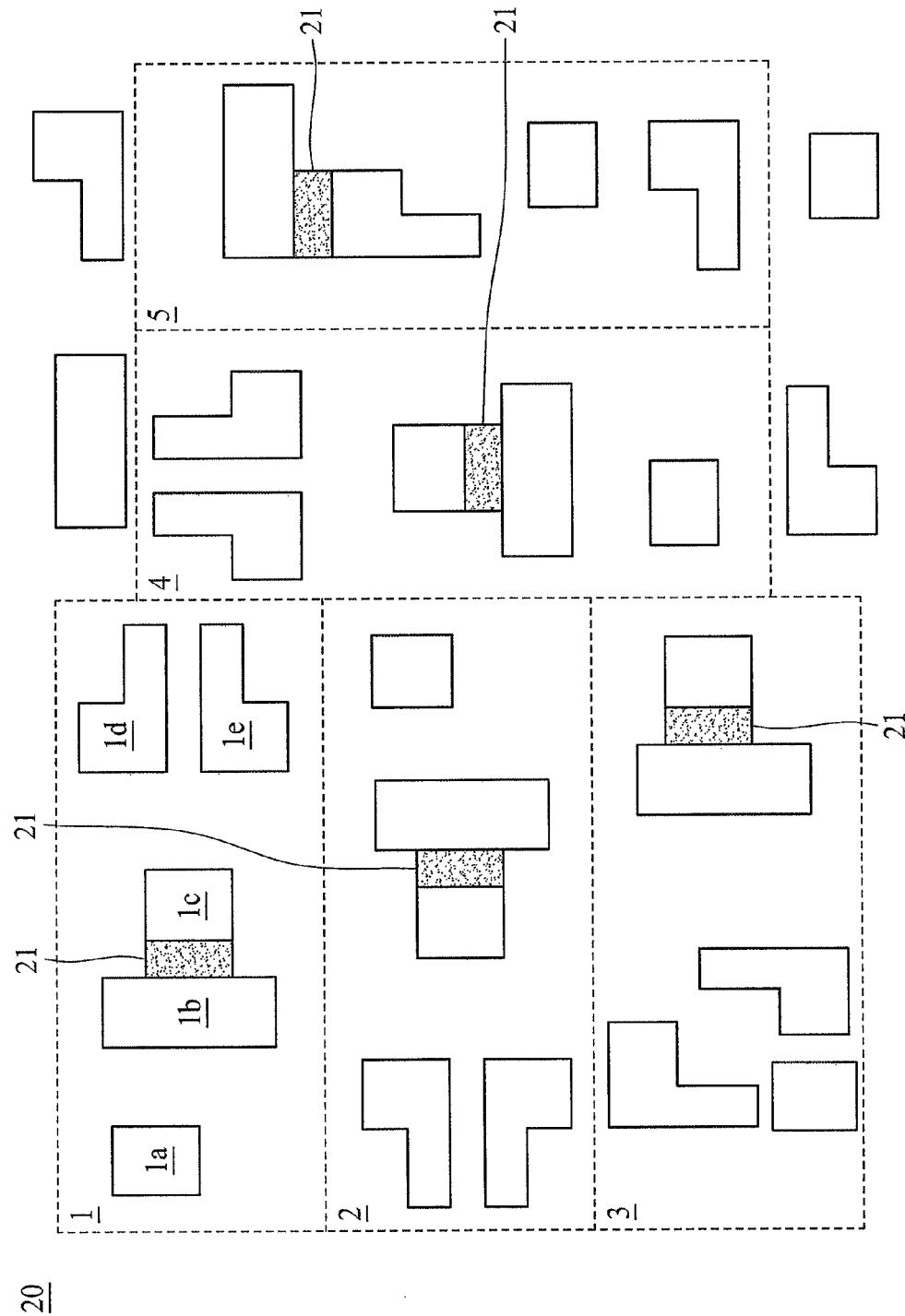
FIG. 2 shows a top view of a portion of a circuit layout, wherein five polygon groups are defined by five dotted boxes according to one embodiment.

FIG. 2 shows a top view of post-OPC aerial images on a portion of a circuit layout 20, wherein five polygon groups 1 to 5 are defined by five dotted boxes, each with a numeral labeled in the top left of each box. In the present embodiment, each dotted box encloses a polygon group (1, 2, 3, 4, or 5) that includes a plurality of polygons. For example, the polygon group 1 includes five polygons (1a, 1b, 1c, 1d, and 1e). The definition of the polygon in the present disclosure is not limited to the geometrical shape composed of multiple straight sides. As with many patterns utilized in lithography, those including curvatures such as a rounded angle or circular shapes are all within the scope of the word polygon used in the present disclosure.

The criteria to determine the boundary of a single polygon group includes at least a potential defect area 21. One embodiment of the present disclosure, as shown in FIG. 2, shows each polygon group containing one dark color polygon which represents the potential defect area 21 identified by the processor 101.

As shown in FIG. 2, the polygon group 1 includes five polygons (1a, 1b, 1c, 1d, and 1e), and after the potential defect area 21 is identified, the five polygons (1a, 1b, 1c, 1d, and 1e) can form a distribution pattern relative to the potential defect area 21.

Each polygon group may have a predetermined area. In some embodiments, the predetermined area is in a range of between 1 $\mu m^{-2}$ and 16 $\mu m^2$. Each polygon group may have a predetermined dimension. In some embodiments, the length of the longest side of the dotted box may be in a range of from 0.5 µm to 2 µm. However, the scope of the present invention is not limited to the embodiment as shown in FIG. 2, the polygon group of other geometrical shapes, for example, circle, square, triangle, polygon, or the like are also applicable.

The potential defect area identified by the processor can be, but is not limited to, a highlighted area corresponding to a defect such as, for example, a bridge defect, other types of defect caused by mask patterns or the arrangements of mask patterns, or the like. The highlighted area is not required to have a predetermined area. Depending on the different simulation tools, some potential defect areas are configured to completely cover the defect region while others are configured not to. For a bridge defect, the potential defect area is typically between two closely disposed polygons. As shown in the first polygon group of FIG. 2, the potential defect area is positioned between an elongated rectangle and a less elongated one.

Figure 3:
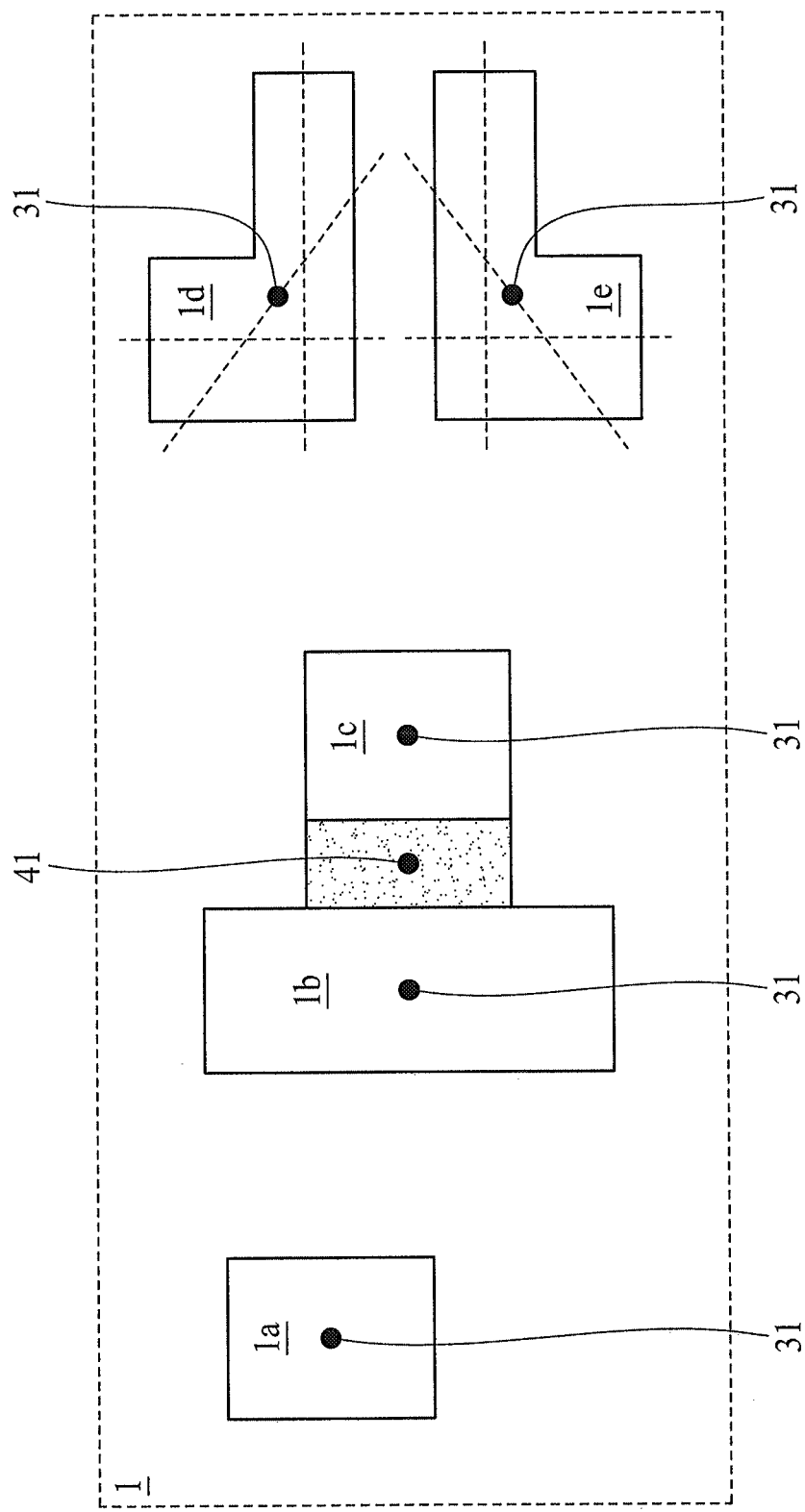
FIG. 3 shows an enlarged view of the first polygon group in FIG. 2, wherein each polygon in the polygon group is marked with a representing point according to one embodiment.

FIG. 3 shows an enlarged view of the first polygon group in FIG. 2. A point 31 is used to represent each polygon. In some embodiments, a representing point 31 is located in each polygon (1a, 1b, 1c, 1d, and 1e) at its geometrical center. However, the representing point 31 of a polygon (1a, 1b, 1c, 1d, and 1e) does not have to be the geometrical center; other locations such as the center of mass can be adopted to represent the polygons (1a, 1b, 1c, 1d, and 1e). The locating manner may be consistent throughout each polygon on the circuit layout. For certain polygons with extended branches, the geometrical center may not necessarily be encompassed in the polygon, but can be located outside of the polygon. Such situation is not a problem with the present disclosure as long as the representing points are generated through a consistent measure. The same manner applies to locating a representing point 41 in the potential defect area 21. Only the representing point 41 of the potential defect area 21 is named "origin" in the present disclosure, because the representing point in the potential defect area serves as an origin in the subsequent procedures.

Figure 4:
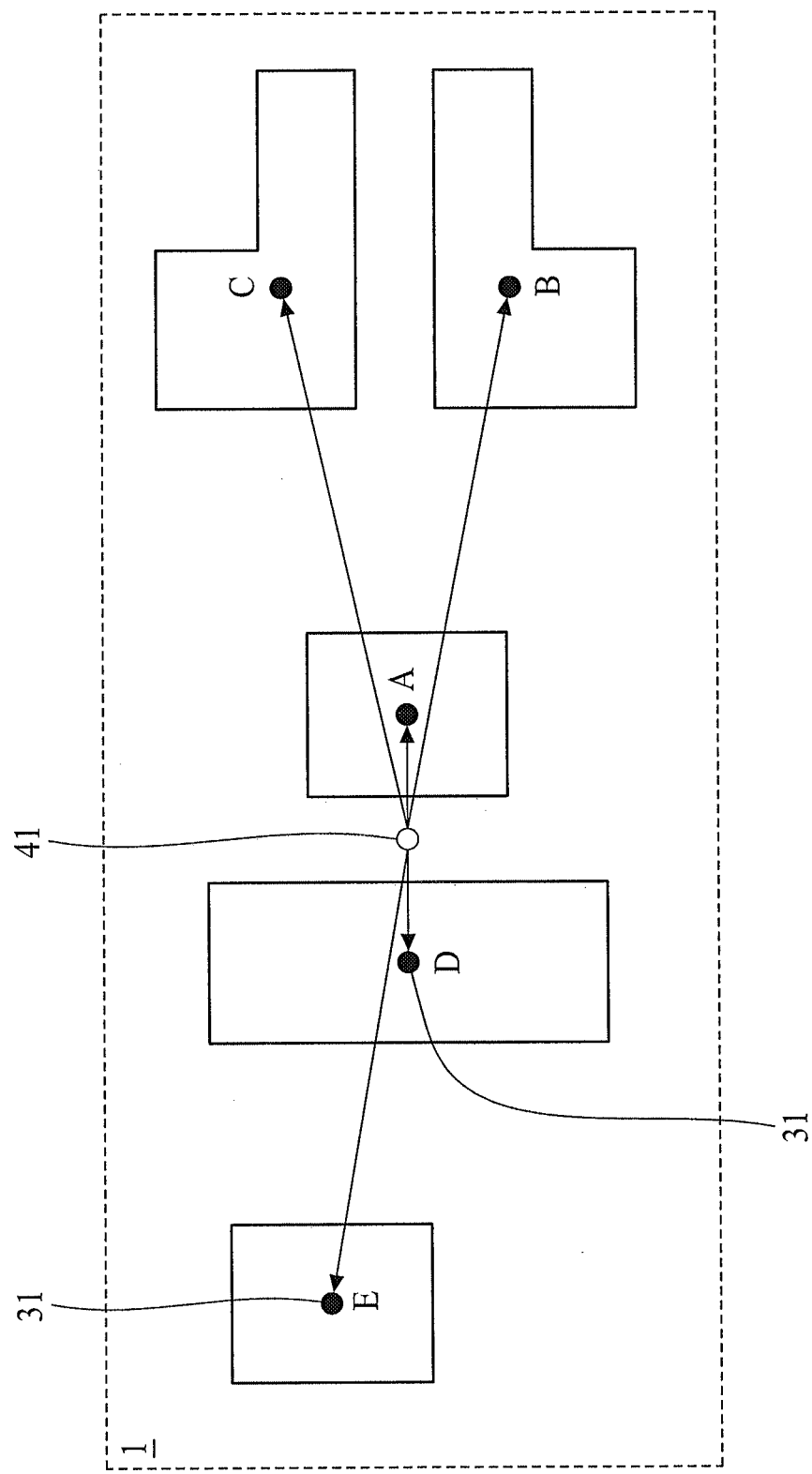
FIG. 4 and FIG. 5 demonstrate a determination process from the representing points into vectors of a Cartesian coordinate according to one embodiment.
Figure 5:
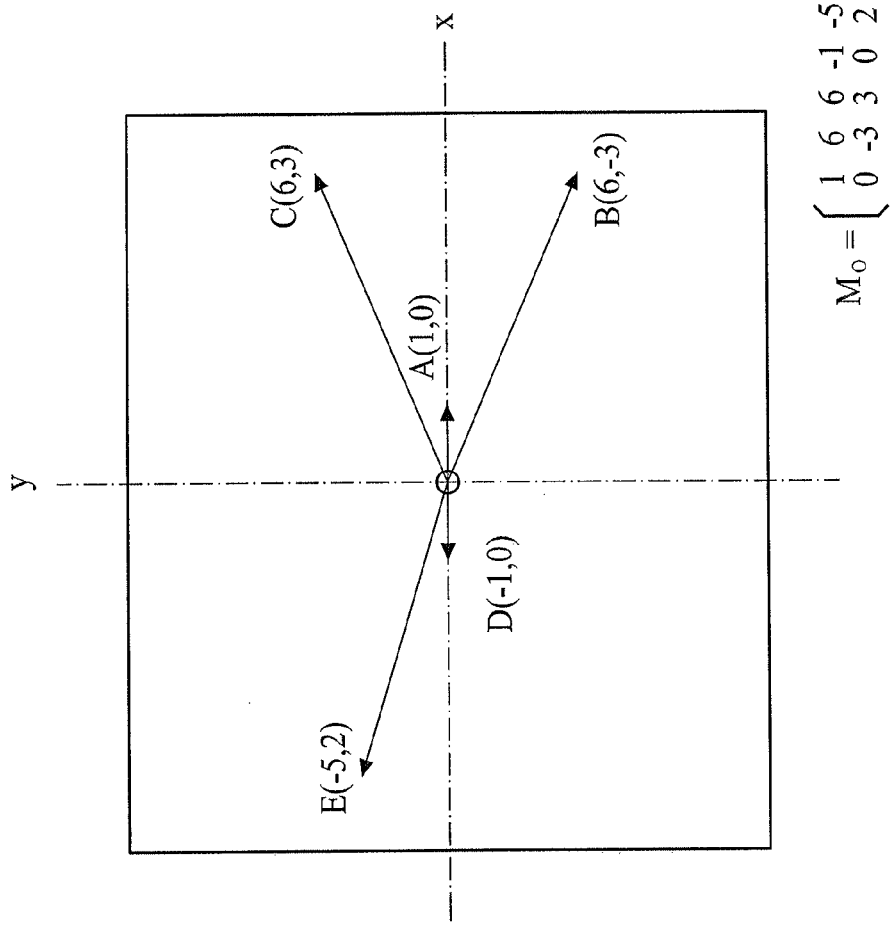

FIG. 4 and FIG. 5 demonstrate a determination process from the geometrical representing points into vectors of a Cartesian coordinate. Referring to FIGS. 3 and 4, five vectors (A, B, C, D, and E) are generated by the processor in the first polygon group 1. The five vectors share a common origin, or the representing point 41 of the potential defect area 21. Each vector (A, B, C, D, and E) starts from the origin and points toward each representing point 31 of the polygon (1a, 1b, 1c, 1d, or 1e). As shown in FIG. 5, the processor automatically generates the five vectors A (1,0), B (6,−3), C (6,3), D (−1,0), and E (−5,2) on a Cartesian coordinate, and then assembles the five vectors into a two by five original matrix $M_O$. However, the type of coordinate system is not limited to Cartesian, other types of coordinate system such as polar and circular are also encompassed by the scope of the present disclosure. The dimension of the matrix is not restricted by the present embodiment; depending on the pattern environment with respect to the highlighted area and the distribution of the highlighted areas themselves, different matrix dimensions can be reasonably generated.

Figure 6:
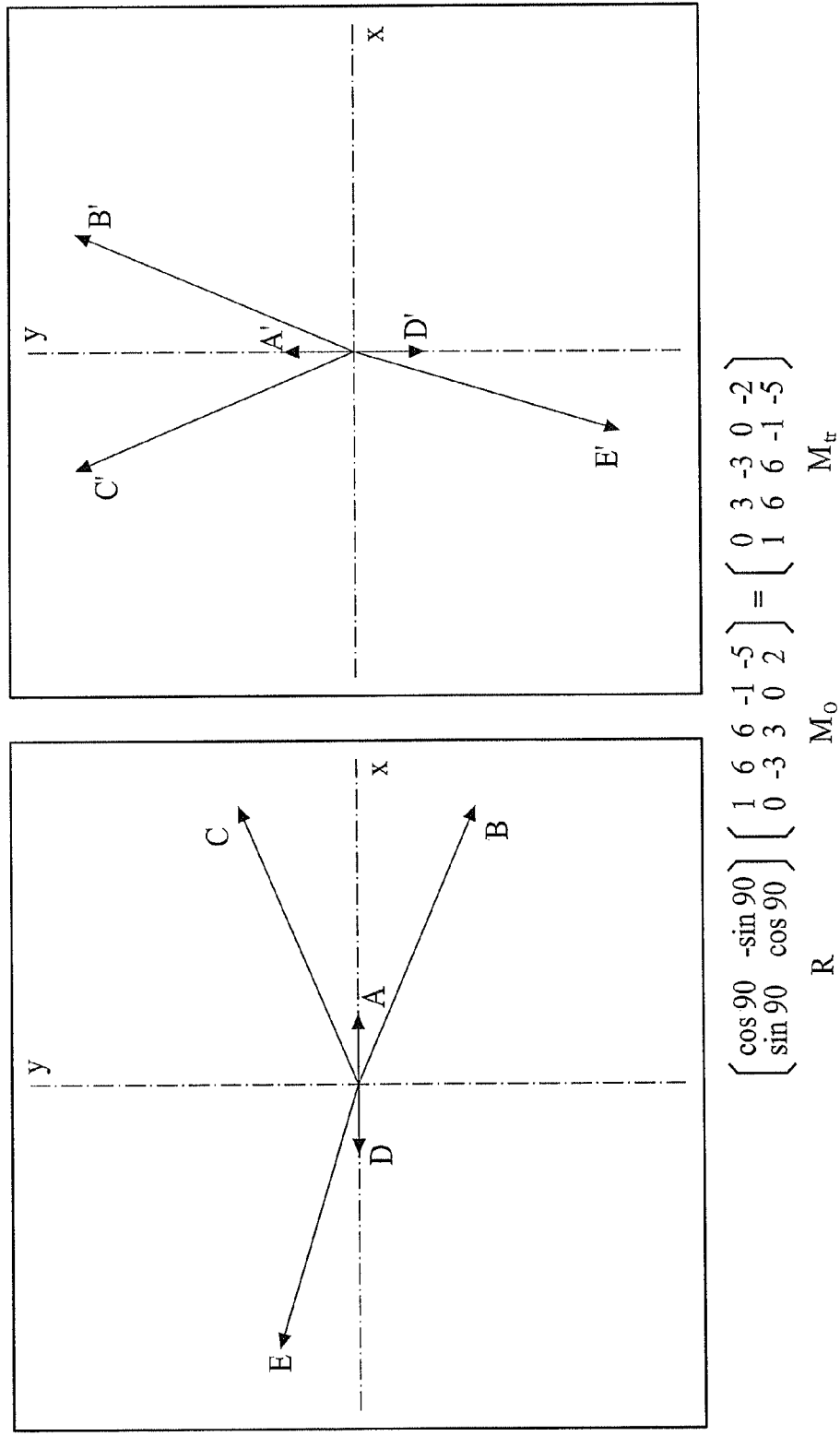
FIG. 6 demonstrates a 90-degree rotation operation of the matrix according to one embodiment.
Figure 7:
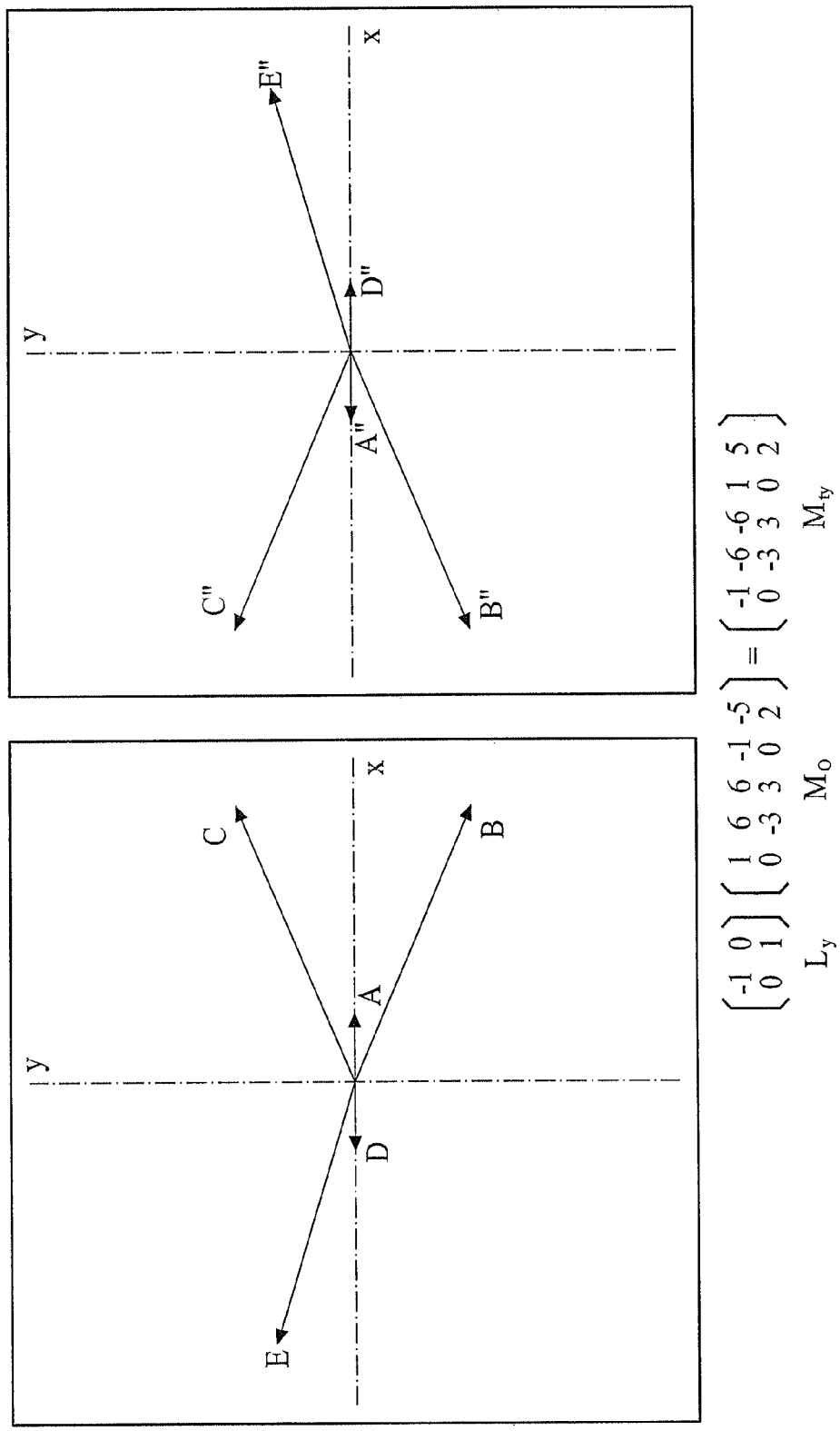
FIG. 7 demonstrates a mirror operation of the matrix with respect to the y-axis according to one embodiment.
Figure 8:
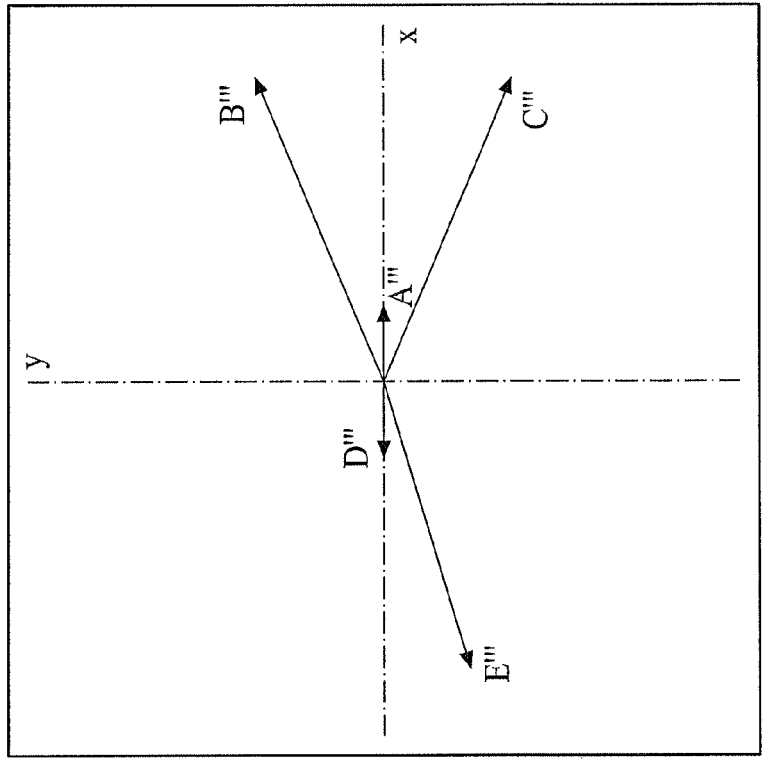
FIG. 8 demonstrates a mirror operation of the matrix with respect to the x-axis according to one embodiment.
Figure 8:
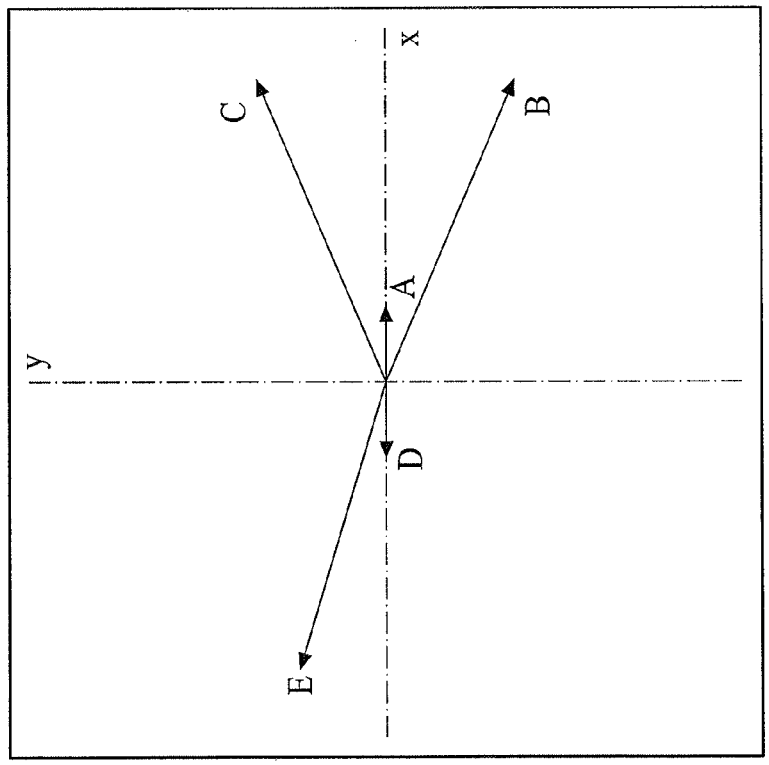

The matrix $M_O$ generated is then subjected to several geometrical operations. To name a few, rotation operation, mirror operation with respect to the y-axis, and mirror operation with respect to the x-axis. However, other geometrical operations such as scale, shear, squeeze, or the like are all applicable to the present disclosure. As shown in FIG. 6, a rotation matrix R is imposed on $M_O$ to make a counter-clockwise, 90-degree rotation of the five vectors. The transformed matrix is now denoted as $M_{tr}$ and is shown in the right hand side of FIG. 6. The $M_{tr}$ is composed of transformed vectors A', B', C', D', and E'. As shown in FIG. 7, a mirror matrix $L_y$ is imposed on $M_O$ to make a flip with respect to the y-axis of the five vectors. The transformed matrix is now denoted as $M_{ty}$ and is shown in the right hand side of FIG. 7. The $M_{ty}$ is composed of transformed vectors A", B", C", D", and E". As shown in FIG. 8, a mirror matrix $L_x$ is imposed on $M_O$ to make a flip with respect to the x-axis of the five vectors. The transformed matrix is now denoted as $M_{tx}$ and is shown in the right hand side of FIG. 8. The $M_{tx}$ is composed of transformed vectors A''', B''', C''', D''', and E'''.

In other embodiments of the present disclosure, additional geometrical operations can be imposed on the original matrix $M_O$. A successive transformation including two or more operations is also applicable to the present disclosure. For example, the matrix $M_O$ can be subjected to a 45 degree rotational matrix followed by a mirror matrix flipping with respect to the y-axis. All the matrices undergoing at least one geometrical operation are named transformed matrix in the present disclosure.

Figure 9:
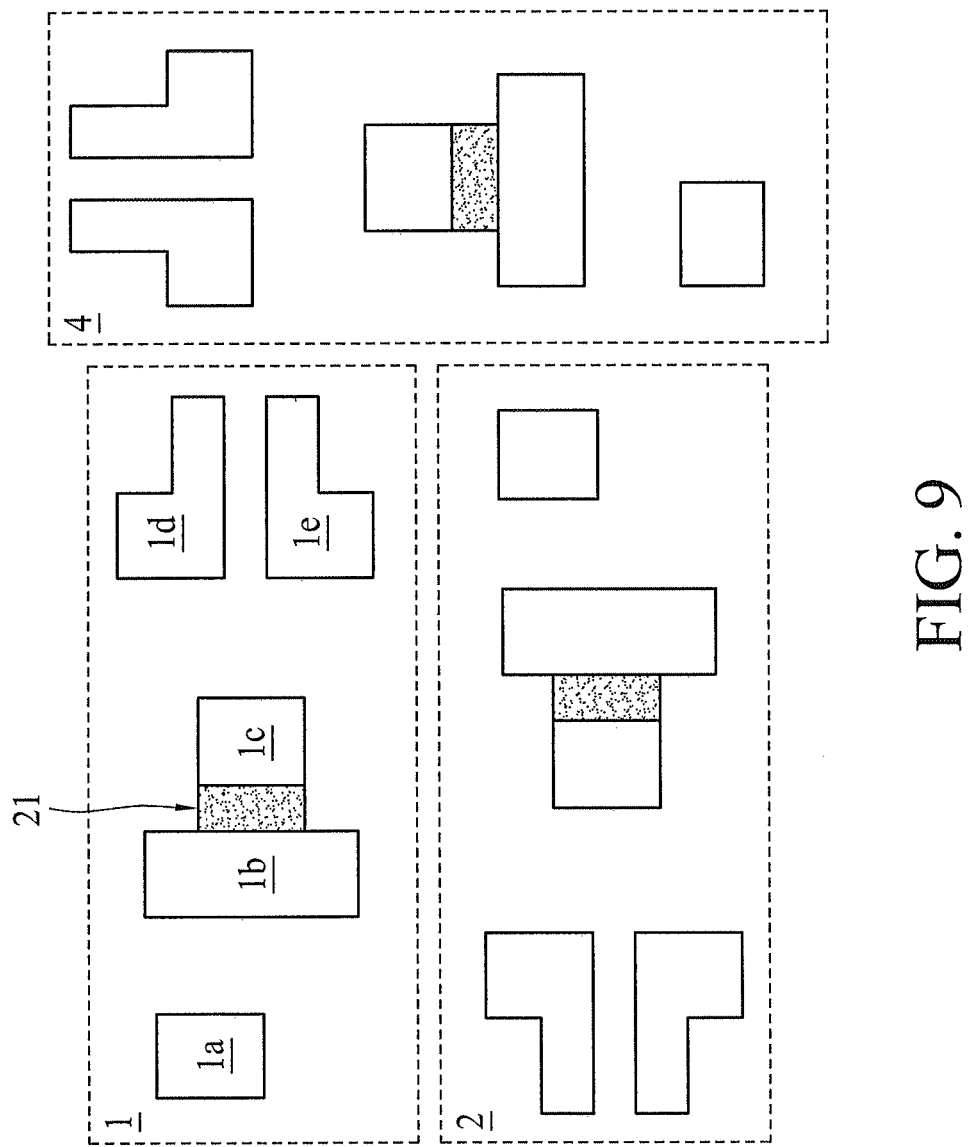
FIG. 9 demonstrates the set of the matrix and the matrices in other polygon groups which are identical to the transformed matrix according to one embodiment.

The processor compares the original matrix and each transformed matrix of one polygon group to the matrices in other polygon groups, when the comparison result generates a match, that is, the transformed matrix is identical to the matrices in other polygon groups, the processor is configured to collect the matched matrices in other polygon groups into, for example, a first set. The matrix which all the transformed matrices are derived from is by default a member in the first set. FIG. 9 shows the grouping of polygon groups including the transformed matrix $M_{ty}$ (the second polygon group) and $M_{tr}$ (the fourth polygon group) with the matrix $M_O$ (the first polygon group). Because all the polygon groups in the first set have a similar pattern environment which is prone to generate bridge defects, the polygon groups in the first set are screened from other polygon groups of the circuit layout and the further check on bridge defects will not be executed on the polygon groups categorized in the first set. The comparison process continues by comparing a matrix or transformed matrices of a next selected polygon group to the matrices of other remaining polygon groups and identifying the polygon groups having matrices that are identical to the matrix or transformed matrices of the next selected polygon group until the last remnant of polygon group have distribution patterns of representing point.

Figure 10:
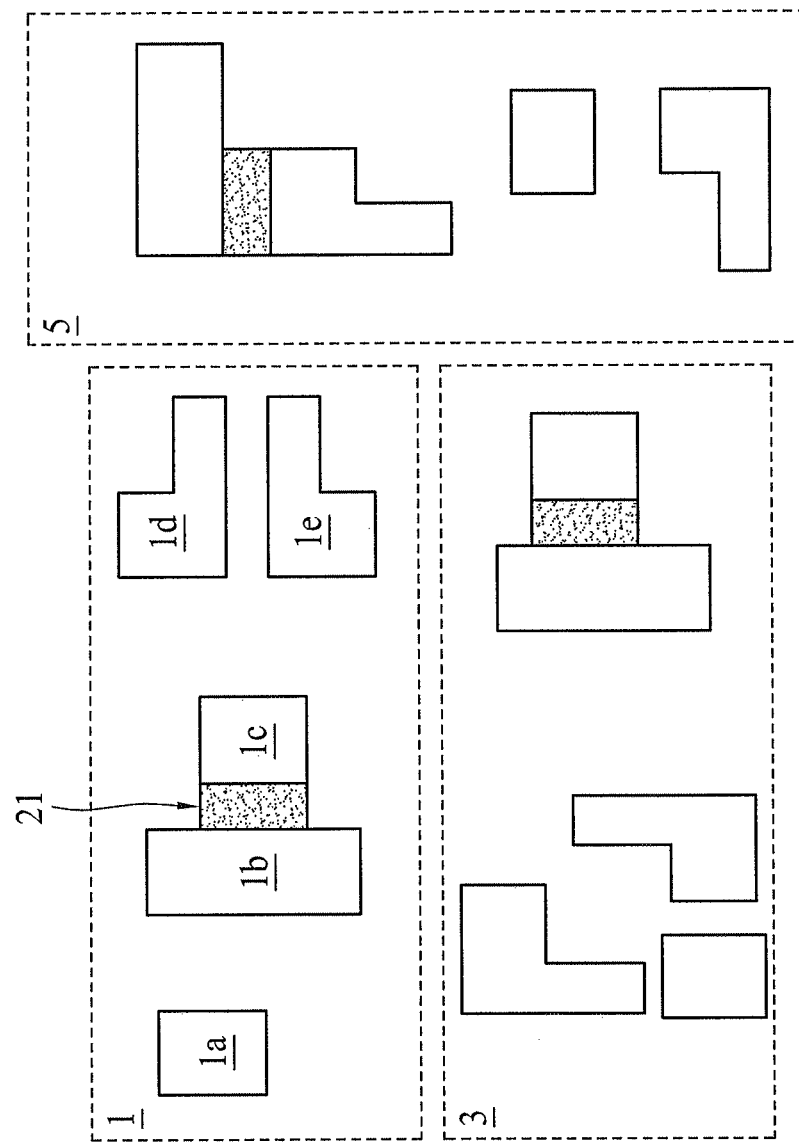
FIG. 10 demonstrates the collection of one polygon group in each set and other polygon groups not being categorized in any set according to one embodiment.

Another potential defect area with another kind of defect can be identified during the early stage of the inspection, and the same method applies to generate a second set. The procedure carries on until a reasonable number of the polygon groups not being categorized in the sets is reached. In one embodiment of the present disclosure, the processor further collects a polygon group from each set and other polygon groups not being categorized in any set for further inspection. As shown in FIG. 10, the first polygon group from the first set is collected with the third polygon group and the fifth polygon group, wherein the latter two cannot be sorted with any transformed matrices. The polygon groups shown in FIG. 10 are subjected to further inspection in order to identify the genre of the defects occurring in the potential defect area.

Only the mirror and the rotation operation are carried out as an example in FIGS. 9 and 10. Other geometrical operations such as scale, shear, squeeze, or the like can also be performed individually or concomitantly to generate a plurality of processed matrices.

Figure 11:
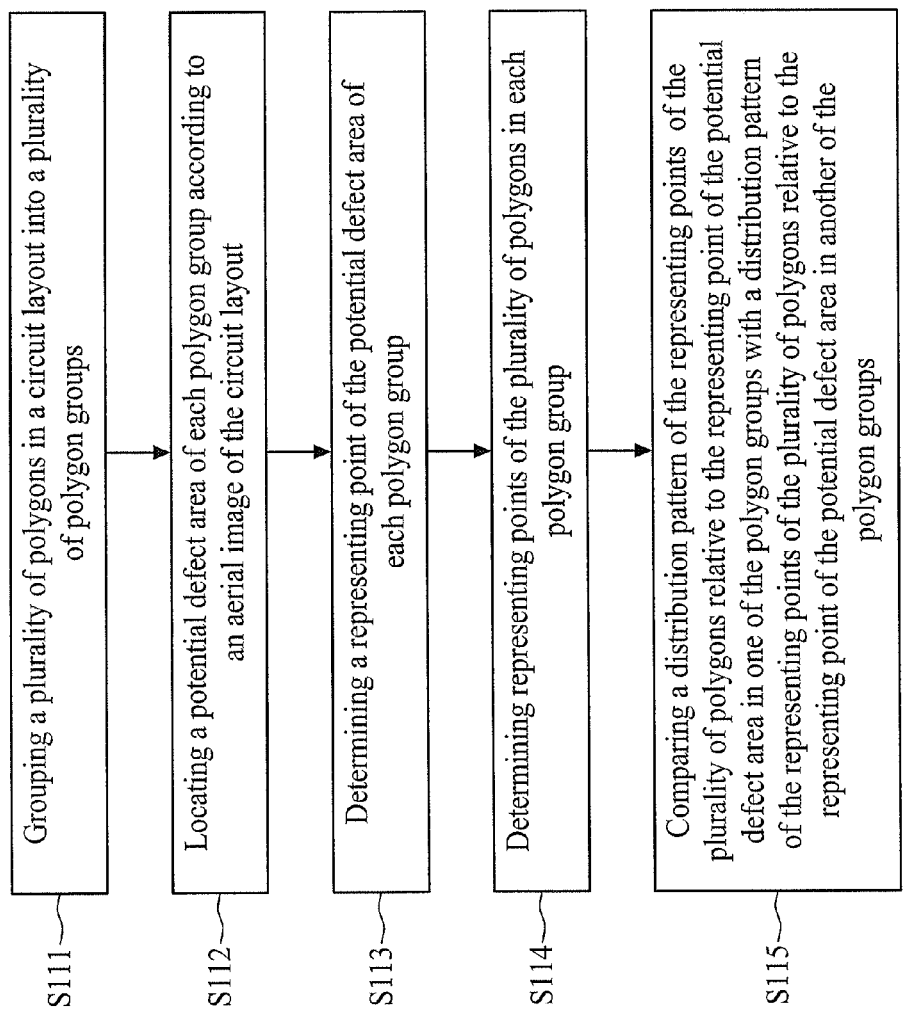
FIG. 11 shows the processes carried out by the mask pattern analysis system according to one embodiment.

FIG. 11 shows the processes carried out by the pattern analysis system. After the simulation result of the aerial patterns is obtained during the ORC step, the following procedures are executed by a processor to perform a time-efficient review on defected patterns. In step S111, a plurality of polygons in a circuit layout is grouped into a plurality of polygon groups; in step S112, according to an aerial image of the circuit layout, a potential defect area in a polygon group is located.

Figure 12:
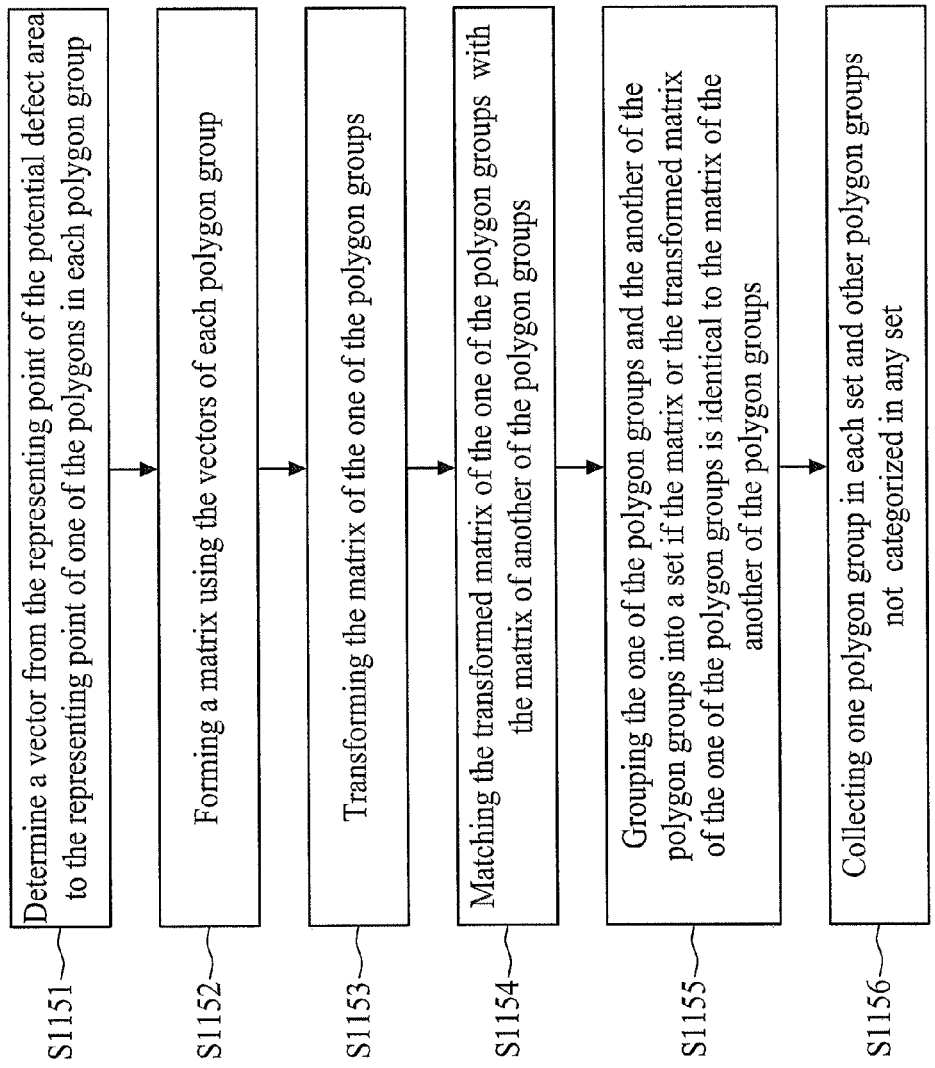
FIG. 12 shows the detail processes of the comparing step in FIG. 11 according to one embodiment.

In step S113, one representing point which can be either the geometrical center or the center of mass is determined by the processor in each polygon of a polygon group. In step S114, one representing point which can be either the geometrical center or the center of mass is determined by the processor in the potential defect area in each polygon group. However, the scope of the present disclosure is not limited to the above method of how the representing point is located, as long as the locating measure is consistent throughout each polygon in the circuit layout. Step S113 and S114 can be carried out in sequence of simultaneously, and no specific order is preferred in the present embodiment. In step S115, a distribution pattern composed of the representing points of the polygons and the representing point of the potential defect area in one polygon group is compared with the pattern distribution of other polygon groups. To be more specific, detail processes of step S115 are shown in FIG. 12.

In step S1151, a vector is determined by connecting the representing point of the potential defect area to the representing point of one polygon in each polygon group. Because a plurality of polygons is encompassed in a polygon group, a plurality of vectors are generated in step S1151. The plurality of vectors are subsequently grouped into a matrix in step S1152, and then subjected to a geometrical operation in step S1153 so as to form a transformed matrix. The number of the transformed matrix depends on the number of geometrical operations performed on the matrix. In one embodiment of the present disclosure, a rotation operation, a mirror operation, and a mirror operation followed by a rotation operation are performed on the original matrix, respectively; therefore three different processed matrices are generated. However, other geometrical operations such as scale, shear, squeeze, or the like, as well as the arbitrary combination of the above are all applicable to be performed on the original matrix.

In step S1154, each transformed matrix derived from the matrix of a selected polygon group is compared to find a match, by the processor, to matrices in other polygon groups. The definition of "match" aforesaid and in the following of the present disclosure is under the condition that a matrix is identical to another matrix. In step S1155, the matrix in the selected polygon group is grouped, by the processor, with other matrices of other polygon groups which appear to be a match to the transformed matrix derived from the matrix of the specific polygon group. All matrices being grouped in a set demonstrate a similar pattern environment, that is, a defect of a same genre is highly likely to occur in each polygon group collected. The collected polygon groups are now screened from other polygon groups not being categorized in the set.

The afore-mentioned steps can be repeatedly applied to group the polygon groups having another similar distribution pattern of representing points. The afore-mentioned steps may be repeated until the remaining polygon groups having different distribution patterns of representing points.

In one embodiment of the present disclosure, if a reasonable number, for example 50, of the polygon groups not being categorized in the sets is exceeded, the process reverts back to step S111 and the procedure is reinitiated by identifying potential defect areas of a different kind of defect; if the reasonable number is met or deceeded, the processor collects one polygon group in each set and other polygon groups not being categorized in any set for further inspection. Multiple iterations can be carried out with a goal of efficiently mapping out the potential defect areas. By implementing the method outlined in FIGS. 11 and 12, the locations of the potential defect areas are recognized by the processor within a much shorter time span.

A person having ordinary skill in the art would readily recognize that steps of various above-described methods can be performed by programmed computers. Herein, some embodiments are intended to cover program storage devices, e.g., digital data storage media, which are machine or computer readable and encode machine-executable or computer-executable programs of instructions where said instructions perform some or all of the steps of methods described herein. The program storage devices may be, for example, digital memories, magnetic storage media such as magnetic disks or tapes, hard drives, or optically readable digital data storage media. The embodiments are also intended to cover computers programmed to perform said steps of methods described herein.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A mask pattern analysis apparatus, comprising:
a processor, configured to:
grouping a plurality of polygons in a circuit layout into a plurality of polygon groups;
locate a potential defect area of each polygon group according to an aerial image of the circuit layout;
determine a representing point of the potential defect area of each polygon group;
determine representing points of the plurality of polygons in each polygon group; and
compare a distribution pattern of the representing points of the plurality of polygons relative to the representing point of the potential defect area in one of the polygon groups with a distribution pattern of the representing points of the plurality of polygons relative to the representing point of the potential defect area in another of the polygon groups.

2. The mask pattern analysis apparatus of claim 1, wherein the processor for comparing the distribution pattern is further configured to:
determine a vector from the representing point of the potential defect area to the representing point of one of the polygons in each polygon group;
form a matrix using the vectors of each polygon group; and
match the matrix of one of the polygon groups with the matrix of another of the polygon groups.

3. The mask pattern analysis apparatus of claim 2, wherein the processor for comparing the distribution pattern is further configured to:
transform the matrix of the one of the polygon groups; and
match the transformed matrix of the one of the polygon groups with the matrix of the another of the polygon groups.

4. The mask pattern analysis apparatus of claim 3, wherein the processor for transforming the matrix of the one of the polygon groups is further configured to rotate or mirror the matrix of the one of the polygon groups.

5. The mask pattern analysis apparatus of claim 1, wherein each polygon group comprises at least one highlighted area.

6. The mask pattern analysis apparatus of claim 1, wherein each polygon group is included in a predetermined area in a range of from 1 μm² to 16 μm².

7. The mask pattern analysis apparatus of claim 1, wherein the representing point of each polygon or the potential defect area is a center of mass or a geometrical center.

8. The mask pattern analysis apparatus of claim 3, wherein the processor is further configured to group the one of the polygon groups and said another of the polygon groups into a set if the matrix or the transformed matrix of the one of the polygon groups is identical to the matrix of the another of the polygon groups.

9. The mask pattern analysis apparatus of claim 8, wherein the processor is further configured to collect one polygon group in each set and other polygon groups not categorized in any set.

10. A method for analyzing a mask pattern, comprising the steps of:
grouping, by a processor, a plurality of polygons in a circuit layout into a plurality of polygon groups;
locating, by the processor, a potential defect area of each polygon group according to an aerial image of the circuit layout;
determining, by the processor, a representing point of the potential defect area of each polygon group;
determining, by the processor, representing points of the plurality of polygons in each polygon group; and
comparing, by the processor, a distribution pattern of the representing points of the plurality of polygons relative to the representing point of the potential defect area in one of the polygon groups with a distribution pattern of the representing points of the plurality of polygons relative to the representing point of the potential defect area in another of the polygon groups.

11. The method for analyzing a mask pattern of claim 10, wherein the comparing step comprises:
determining a vector from the representing point of the potential defect area to the representing point of one of the polygons in each polygon group;
forming a matrix using the vectors of each polygon group; and
matching the matrix of one of the polygon groups with the matrix of another of the polygon groups.

12. The method for analyzing a mask pattern of claim 11, wherein the matching step comprises:
transforming the matrix of the one of the polygon groups; and
matching the transformed matrix of the one of the polygon groups with the matrix of the another of the polygon groups.

13. The method for analyzing a mask pattern of claim 12, wherein the transforming step comprises performing a rotation operation, a mirror operation, or the combination thereof on the matrix.

14. The method for analyzing a mask pattern of claim 10, wherein the representing point of the potential defect area comprises a center of mass or a geometrical center in the potential defect area.

15. The method for analyzing a mask pattern of claim 10, wherein the representing point of the plurality of polygons comprises a center of mass or a geometrical center in the plurality of polygon.

16. The method for analyzing a mask pattern of claim 12, further comprising:
grouping the one of the polygon groups and the another of the polygon groups into a set if the matrix or the transformed matrix of the one of the polygon groups is identical to the matrix of the another of the polygon groups.

17. The method for analyzing a mask pattern of claim 16, further comprising collecting one polygon group in each set and other polygon groups not categorized in any set.

18. A non-transitory data storage device encoding a machine executable program that performs a method as in a method for analyzing a mask pattern, comprising the steps of:
grouping, by a processor, a plurality of polygons in a circuit layout into a plurality of polygon groups;
locating, by the processor, a potential defect area of each polygon group according to an aerial image of the circuit layout;
determining, by the processor, a representing point of the potential defect area of each polygon group;
determining, by the processor, representing points of the plurality of polygons in each polygon group; and
comparing, by the processor, a distribution pattern of the representing points of the plurality of polygons relative to the representing point of the potential defect area in one of the polygon groups with a distribution pattern of the representing points on the plurality of polygons relative to the representing point of the potential defect area in another of the polygon groups.

* * * * *